United States Patent [19]

Burkle et al.

[11] 4,299,907
[45] Nov. 10, 1981

[54] STORAGE STABLE PHOTOSENSITIVE DIAZO LITHOGRAPHIC PRINTING PLATES

[75] Inventors: Stephen E. Burkle, Warwick, R.I.; Albert S. Deutsch, Hartsdale; Robert S. Piller, Hastings, both of N.Y.

[73] Assignee: Polychrome Corporation, Yonkers, N.Y.

[21] Appl. No.: 94,527

[22] Filed: Nov. 15, 1979

Related U.S. Application Data

[63] Continuation of Ser. No. 932,740, Aug. 10, 1978, abandoned.

[51] Int. Cl.³ .................. G03C 1/54; G03C 1/60; G03C 1/70
[52] U.S. Cl. .................. 430/175; 430/176; 430/177; 430/331
[58] Field of Search .............. 430/175, 176, 302, 177

[56] References Cited

U.S. PATENT DOCUMENTS

| | | | |
|---|---|---|---|
| 3,136,637 | 6/1964 | Larson | 430/162 |
| 3,235,382 | 2/1966 | Neugebauer et al. | 430/302 |
| 3,235,383 | 2/1966 | Steppan et al. | 430/175 |
| 3,300,309 | 1/1967 | Chu | 430/302 |
| 3,342,601 | 9/1967 | Houle et al. | 430/161 |
| 3,382,069 | 5/1967 | Borchers et al. | 430/302 |
| 3,486,450 | 12/1969 | Houle et al. | 430/175 |
| 3,671,236 | 6/1972 | Van Beusekom | 430/175 |
| 3,929,488 | 12/1975 | Smith | 430/176 |
| 4,093,465 | 6/1978 | Chu et al. | 430/175 |
| 4,132,553 | 1/1979 | Burkle et al. | 430/146 |

*Primary Examiner*—Charles L. Bowers, Jr.

[57] ABSTRACT

Storage stable lithographic printing plates employing novel light sensitive, high molecular weight diazo polymers are herein provided. The novel diazo polymers of the instant invention have the generic formula:

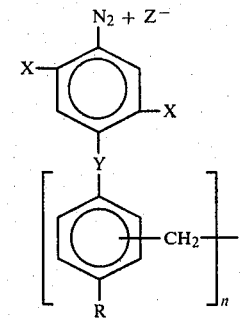

Where
R is methyl or hydrogen
X is methoxy, ethoxy or hydrogen
Y is oxygen or sulfur
Z is an anion of a sulfonic, carboxylic or phosphonic acid
n is an integer from 8 to 970.

3 Claims, No Drawings

STORAGE STABLE PHOTOSENSITIVE DIAZO LITHOGRAPHIC PRINTING PLATES

This application is a continuation of U.S. patent application Ser. No. 932,740 filed Aug. 10, 1978, now abandoned.

BACKGROUND OF THE INVENTION

This invention relates to novel compositions of matter useful as lithographic photosensitizers. More specifically, the present invention relates to novel storage stable diazo photosensitizers useful in the manufacture of lithographic printing plates. Still more particularly the instant invention relates to novel lithographic photosensitizers which are optionally blended with a suitable dye and a compatible resin in an acceptable solvent system to form compositions which when applied to substrates form commercially satisfactory lithographic printing plates having extended shelf lives.

It has been a problem in the past to produce commercially satisfactory lithographic printing plates which retain their ability to be effectively exposed and developed many years after their original manufacture. Planographic printing plates must be carefully prepared so as to maintain their ability to differentiate between hydrophilic and oleophilic areas on its surface.

The prior art has described a plethora of photosensitive compositions which may be employed to produce such plates. One such example is the condensation product of paradiazo diphenyl amine with paraformaldehyde which has subsequently been reacted with a sulfonic acid. Typically, the shelf life of materials which have been used in the past to form such plates is less than two years and usually from about 1 year to 1½ years.

The present invention provides a lithographic printing plate employing certain specific photosensitizers wherein the obtained shelf life is in excess of five years.

DESCRIPTION OF THE PRIOR ART

It is known in the part to produce diazo type photosensitizers. In particular, U.S. Pat. No. 3,373,021 discloses diazo compounds which are relatively low molecular weight monomers, whereas the instant invention includes only high molecular weight polymers.

SUMMARY OF THE INVENTION

The present invention provides novel diazo type polymeric photosensitizers useful in the manufacture of storage stable lithographic printing plates. Characteristically said photosensitizers substantially extend the shelf life demonstrated by said plates as compared to other photosensitizers known to the prior art. The polymeric photosensitizers of the instant invention are represented by the formula:

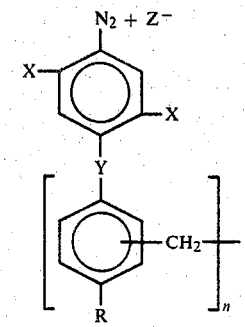

where
R is methyl or hydrogen
X is methoxy, ethoxy or hydrogen
Y is oxygen or sulfur
Z is an anion of a sulfonic, carboxylic or phosphonic acid
n is an integer from 8 to 970

It is, therefore, a primary object of the present invention to provide novel diazo type polymeric photosensitizers useful for the production of lithographic printing plates.

It is another object of the present invention to provide novel diazo type polymer photosensitizers useful for the production of lithographic printing plates having an extended shelf life.

These and other objects of this invention will be in part discussed and in part apparent upon consideration of the detailed description of the preferred embodiment provided hereinafter.

DETAILED DESCRIPTION OF THE PREFERRED EMBODIMENT

In accordance with the present invention, light sensitive, high molecular weight diazo polymers having the generic formula:

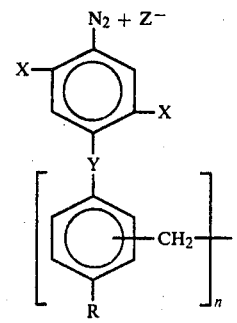

where
R is methyl or hydrogen
X is methoxy, ethoxy or hydrogen
Y is oxygen or sulfur
Z is an anion of a sulfonic, carboxylic or phosphonic acid
n is an integer from 8 to 970
are produced such that a polymer having a molecular weight of from about 5,000 to about 500,000 is attained.

In the above formula the anions usable within the context of the instant invention include anions which form a stable salt with the diazo resin and which render it soluble in organic solvents. These include the anions derived from organic carboxylic acids such as, decanoic acid and benzoic acid, organic phosphonic acids such as phenylphosphonic acid, and sulfonic acids, typical examples of which include aliphatic and aromatic sulfonic acids, such as methane sulfonic acid, chloroethanesulfonic acid, dodecanesulfonic acid, benzenesulfonic acid, toluenesulfonic acid, mesitylenesulfonic acid, and anthraquinonesulfonic acid. Preferred sulfonic acids are 2-hydroxy-4-methoxybenzophenone-5-sulfonic acid, hydroquinonesulfonic acid, 4-acetylbenzenesulfonic acid and dimethyl-5-sulfoisophthalate.

Generally in the production of the composition of the instant invention, a diazonium salt is treated with paraformaldehyde and sulfuric acid. The reaction product thus produced is then treated with a sulfonic, carboxylic or phosphonic acid to produce the desired condensation product herein described. This light sensitive composition may optionally be blended with such oleophilic binding resins as, polyamides, polyesters, polyethers, polycarbonates, polystyrenes, polyurethanes, polyvinyl chloride and its copolymers, polyvinylketals, polynitriles, polysulfones. The selection of particular ingredients and reaction conditions is made and controlled by the skilled worker to achieve a composition having the desired properties including molecular weight.

In a series of preferred embodiments, it has been found beneficial to produce the composition of the instant invention such that in the formula set forth hereinabove, R is methyl, X is ethoxy, Y is sulfur, Z is 2-hydroxy-4-methoxy benzophenone-5 sulfonic acid and n is selected such that the molecular weight of the polymer is from about 60,000 to about 80,000.

The following specific examples illustrate the invention and methods of producing the polymers but it is to be understood that variations and modifications can be made therein without departing from the spirit and scope of the invention.

EXAMPLE 1

120 g of 2,5-diethoxy-4-tolylmercaptodiazobenzene zinc chloride double salt was added slowly to 385 ml of 98% sulfuric acid at 25° C. and stirred for 15 minutes while hydrogen chloride evolved. 8.03 g of paraformaldehyde was added and the mixture was stirred for 4 hours at 32°±2° C. The reaction product was poured into 2.9 liters of ice water with stirring and treated with a cold concentrated solution of 383 g of zinc chloride in water. The precipitate was recovered by suction filtration and the partially dry cake was dissolved in 3.8 liters of water, filtered, cooled with ice and treated with a solution of 96 g of 2-hydroxy-4-methoxybenzophenone-5-sulfonic acid in water. The precipitate was recovered by filtration and air dried to obtain 175 g of brittle solid.

EXAMPLE 2

The light sensitive diazo resin from 2,5-dimethoxy-4-tolymercaptodiazobenzene zinc chloride double salt was prepared according to example 1. A light sensitive coating solution incorporating this material was prepared by the following method.

To 80 ml. methylene chloride, 56 ml. methanol, 35 ml. methyl cellosolve and 3.5 ml. of dimethylformamide was added 2.0 g. of the above material, 1.0 g. of Epon 1031 resin, 0.5 g. of Formvar 12/85 resin, 1.6 g. of a 60% solution of a polyester resin, 0.2 g. Basic blue dye, 0.02 g. of 2-hydroxy-4-methoxybenzophenone-5-sulfonic acid available from GAF under the name MS-40, 0.03 g. methyl orange and 4 ml. of a phosphoric acid solution prepared by diluting 1 g. of concentrated phosphoric acid in 100 ml. of methyl cellosolve. The materials were added to the solvent mixture while the mixture was stirred. Each material readily dissolved.

The photosensitive solution was whirl-coated onto a grained anodized aluminum plate having a sodium silicate interlayer at a speed 80 rpm. During whirl-coating the aluminum plate was heated with electrical heating units. The temperature of the aluminum was approximately 70 to 80 degrees C. Within one minute the plate was dry and was kept in the whirl-coated and heated for a total of 5 minutes. This coating is identified as coating A.

Coating B was prepared by the same procedure as Coating A except that only 1 g. of the diazo resin was used.

Coating C was prepared by the same procedure as Coating A except that a different diazo sensitizer was used. That sensitizer is the commonly used diazo resin for lithographic plates and is made by the condensation of p-diazodiphenylaminebisulfate with p-formaldehyde. The water soluble resin is then further reacted with MS-40 to form a sulfonate.

All three coatings as soon as they were prepared were imaged through a negative in a Berkey Exposure Unit by a method well known in the art. After light exposure they were developed with a developer. The plates are negative-working and the non-exposed areas were removed. The three coatings all produced satisfactory images and were totally developed. The non-image areas were all hydrophilic. No coating remained on the aluminum in the non-light exposed areas.

The developer used in this test was made according to the following formula,

| Water | 998 ml. |
| --- | --- |
| Lithium benzoate | 963 ml. |
| Cyna-50 (Surfactant available from Mona Industries) | 860 ml. |
| Sodium Lauryl Sulfate | 247 g. |
| Sodium Citrate | 247 g. |
| n-Propanol | 482 ml. |
| Benzyl Alcohol | 138 ml. |

In developing the exposed coating a sufficient amount of developer is used to cover the entire plate. The developer is kept in contact with the plate for 30 seconds before the developer is rubbed into the plate gently by the use of a cotton swab or pad. The developer is then removed from the plate by the use of a squeegee. A second application of developer is applied to the plate and the process is repeated.

After the development process, it is usually apparent if part of the coating remains in the unexposed areas. If any part of the coating remains, it would be colored. As a further test, in determining if the unexposed areas are totally removed the process of printing on a printing press is simulated. The plate is first treated with water and the excess water is removed by a squeegee. The wet plate is then rubbed gently with a cotton swab that contains a blotch of a typical lithographic ink. The image will accept the ink while the non-image areas will not accept ink. All three coatings did not accept ink in the non-light exposed areas. The coatings in these areas are therefore totally removed.

One problem in the preparation of lithographic plates is that the light sensitive coatings are not sufficiently stable and when stored for an extended period of time at room temperature will undergo chemical changes. These changes manifest themselves by changing the solubility characteristics of the coating in the developer which is obviously undesirable and cause the coatings to be unuseable.

To predict the long term stability properties of the 3 coatings, they were heated in an oven at 60 degrees C. for periods ranging from 5 days to 3 weeks. The coatings were then exposed and developed as previously described. The results are summarized in the table below.

| DAYS OF OVEN AGING AT 60 DEGREES C. | | | | |
|---|---|---|---|---|
| | 5 Days | 7 Days | 14 Days | 21 Days |
| Coating A | Stable | Stable | Stable | Stable |
| Coating B | Stable | Stable | Stable | Stable |
| Coating C | Stable | Unstable | Unstable | Unstable |

A simulated oven aging of one day at 60 degrees C. translates to a 3 month shelf life. It can readily be seen that Coating C, which is known in the art, is stable for an estimated 1¼ year shelf life and unstable by 1¾ years. However, the sensitizer of the present invention has been shown to be stable for over 5¼ years.

As a series of preferred embodiments, a composition produced according to the present invention is applied at a coating weight of from about 10 mg/sq.ft. to about 200 mg/sq.ft. on an aluminum sheet and dried. The thus formed coated film may then be exposed to ultraviolet radiation through a transparency in a manner well known to the art and developed using a suitable developer such as Polychrome's 922 developer.

It is, of course, to be understood that the foregoing disclosure is intended to illustrate the invention and that numerous changes can be made in the ingredients, conditions and proportions set forth without departing from the scope of the invention as disclosed and defined in the claims appended hereafter.

What is claimed is:

1. A lithographic printing plate which comprises an aluminum sheet substrate having coated thereon a composition which is comprised of,
   I. a light sensitive, high molecular weight diazo polymer having the formula:

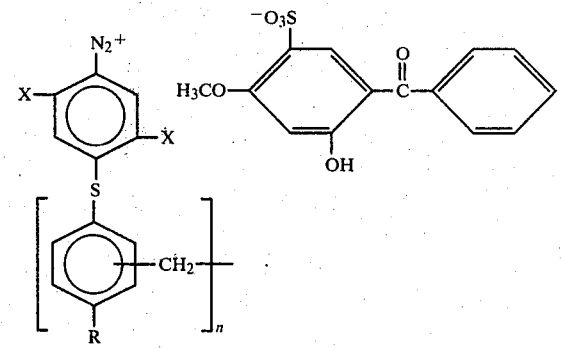

where
   R is methyl or hydrogen
   X is methoxy, ethoxy or hydrogen
   n is an integer from 8 to 970
   II. an oleophilic binding resin which is an admixture of
      (a) an epoxy resin;
      (b) a polyester; and
      (c) a poly(vinyl acetal) and
   III. a colorant which is an admixture of methyl orange and Basic blue dye.

2. The plate according to claim 1 wherein X is methoxy, R is methyl, and the poly(vinyl acetal) is a poly(vinyl formal).

3. The plate according to claim 1 wherein X is ethoxy, R is methyl, and the poly(vinyl acetal) is a poly(vinyl formal).

* * * * *